United States Patent
Park et al.

(10) Patent No.: US 7,576,994 B2
(45) Date of Patent: *Aug. 18, 2009

(54) STRUCTURE FOR FIXING PRINTED CIRCUIT BOARD AND METHOD OF FIXING THEREOF

(75) Inventors: Chul Park, Gyeongsangbuk-Do (KR); Moon Kyo Bae, Gyeongsangnam-Do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/905,602

(22) Filed: Oct. 2, 2007

(65) Prior Publication Data

US 2008/0030940 A1 Feb. 7, 2008

Related U.S. Application Data

(63) Continuation of application No. 10/962,513, filed on Oct. 13, 2004, now Pat. No. 7,280,367.

(30) Foreign Application Priority Data

Apr. 30, 2004 (KR) ............................ 30762/2004

(51) Int. Cl. *H05K 5/00* (2006.01)

(52) U.S. Cl. ...................... 361/757; 361/753

(58) Field of Classification Search ................. 361/737, 361/742, 758, 804, 807, 757

See application file for complete search history.

(56) References Cited

U.S. PATENT DOCUMENTS

| 6,522,549 B2* | 2/2003 | Kano et al. ............... 361/737 |
| 6,708,401 B2* | 3/2004 | Miyakawa et al. ......... 29/832 |
| 7,301,776 B1* | 11/2007 | Wang et al. .............. 361/737 |
| 2006/0098415 A1 | 5/2006 | Kim et al. |
| 2006/0139889 A1 | 6/2006 | Lin et al. |

FOREIGN PATENT DOCUMENTS

| JP | 04-220623 | 8/1992 |
| JP | 05-034713 | 2/1993 |
| JP | 2000-181370 | 6/2000 |
| JP | 2000-235176 | 8/2000 |
| JP | 2001-201733 | 7/2001 |
| JP | 2003-157023 | 5/2003 |

* cited by examiner

*Primary Examiner*—Tuan T Dinh
*Assistant Examiner*—Yuriy Semeneko
(74) *Attorney, Agent, or Firm*—Morgan Lewis & Bockius LLP

(57) ABSTRACT

A structure of fixing a printed circuit board includes a mold frame coupled with a display panel, a printed circuit board positioned at a rear surface of the display panel and electrically connected to a pad portion of the display panel, and an insulating film covering an outer surface of the printed circuit board.

12 Claims, 4 Drawing Sheets

STRUCTURE FOR FIXING PRINTED CIRCUIT BOARD AND METHOD OF FIXING THEREOF

This application is a Continuation of U.S. patent application Ser. No. 10/962,513 filed Oct. 13, 2004 now U.S. Pat. No. 7,280,367 and claims the benefit of Korean Patent Application No. 30762/2004 filed in Korea on Apr. 30, 2004, both of which are hereby incorporated by reference in their entirety.

BACKGROUND OF THE INVENTION

1. Field of the Invention

The present invention relates to a liquid crystal display device, and more particularly, to a structure of fixing a printed circuit board on a liquid crystal display panel and a method for fixing thereof that provide an insulating film to protect the printed circuit board and fix the printed circuit board without a hook or a screw.

2. Discussion of the Related Art

A display device is considered to be more and more important as visual information transmission increases. In addition, as display devices being increasing used in portable devices, they need to have high resolution images, lightness, thin profile, compact size, and low power consumption.

In general, display devices are classified into a light-emitting type or a non-light-emitting type. The light-emitting type display devices include cathode ray tube (CRT) devices, electro-luminescent (EL) devices, light emitting diode (LED) devices, vacuum fluorescent display (VFD) devices, field emission display (FED) devices, and plasma display panel (PDP) devices, which emit light by themselves. The non-light emitting type display devices include liquid crystal display (LCD) devices, which cannot emit light by itself.

LCD devices use the optical anisotropy and polarization properties of liquid crystal molecules to generate a desired image. In particular, liquid crystal molecules can be aligned in a specific orientation, which can be controlled by applying an electric field across the liquid crystal molecules. Due to optical anisotropy, incident light is refracted according to the orientation of the liquid crystal molecules, thereby generating the desired image.

FIG. 1 is a disassembled perspective view schematically showing a liquid crystal display device according to the related art. In FIG. 1, a liquid crystal display device includes a liquid crystal display panel 10, driving circuit units 20 and 30, and a backlight unit 40, which are enclosed by an upper case 50 and a lower case 60. Although not shown, the liquid crystal display panel 10 includes an array substrate, a color filter substrate, and a liquid crystal layer formed between the array substrate and the color filter substrate.

In addition, the driving circuit units 20 and 30 supply driving signals to the liquid crystal display panel 10 for displaying an image on the liquid crystal display panel 10. The driving circuit units 20 and 30 include printed circuit boards 21 and 31 to which tape carrier packages (TCP) 22 and 32 are attached, respectively. The tape carrier package 22 is a gate tape carrier package, and the tape carrier package 32 is a data tape carrier package. Although not shown, the driving circuit units 20 and 30 also include other devices, such as a timing controller, a data driver integrated circuit (IC) mounted on the data tape carrier package 32, and a gate driver integrated circuit mounted on the gate tape carrier package 22.

The backlight unit 40 is at a rear side of the liquid crystal display panel 10 and emits light onto the liquid crystal display panel 10. In addition, the backlight unit 40 includes a lamp assembly including a fluorescent lamp (not shown) for generating light, a reflection sheet 41 for reflecting light emitted from the fluorescent lamp, a light guide plate 42 for guiding the reflected light, and a plurality of optical sheets 43 for diffusing and collecting light transferred from the light guide plate 42. Further, the backlight unit 40 is mounted in a mold frame 44.

Further, the data tape carrier package 32 is bent to position the data printed circuit board 31 at a rear surface of the liquid crystal display panel 10. In addition, the gate tape carrier package 22 is bent once. Since the gate printed circuit board 21 generally is small, the gate printed circuit board 21 is positioned along a side surface of the mold frame 44 by bending the gate tape carrier package 22 once. By positioning the gate printed circuit board 21 along the side surface of the mold frame and positioning the data printed circuit board 31 at the rear surface of the liquid crystal panel 10, a display area of the liquid crystal display panel 10 is increased.

FIG. 2A is a planar view of a portion of a rear side of a liquid crystal display device without a lower case according to the related art. In FIG. 2A, the data printed circuit board 31 is attached and affixed to the mold frame 44 by a hook H. By forming the hook H at a predetermined portion of the mold frame 44 and inserting the data printed circuit board 31 into a lower portion of the hook H, the data printed circuit board 31 is affixed on the mold frame 44. However, in a process of assembling and disassembling the printed circuit board 31, the tape carrier package 32 or a chip-on-film (COF) attached to the printed circuit board 31 can be damaged easily. Thus, it typically takes longer time to assemble or disassemble a printed circuit board, which is affixed by a hook. In addition, whenever the hook needs to be removed, the printed circuit board also can be damaged by the process.

FIG. 2B is a planar view of a portion of a rear side of another liquid crystal display device according to the related art. In FIG. 2B, the data printed circuit board 31 is attached and affixed to the mold frame 44 by screws S. By fastening the screws S through the data printed circuit board 31 at predetermined portions of the mold frame 44, the data printed circuit board 31 is affixed on the mold frame 44. However, it typically takes longer time to ensure the screws S are securely fastened, thereby increasing an operator's work load and reducing productivity.

SUMMARY OF THE INVENTION

Accordingly, the present invention is directed to a structure of fixing a printed circuit board and a method for fixing thereof that substantially obviate one or more of the problems due to limitations and disadvantages of the related art.

An object of the present invention is to provide a structure of fixing a printed circuit board and a method for fixing thereof using an insulating film, such as polyethylene terephthalate (hereinafter called "PET"), for affixing and protecting the printed circuit board without a hook or a screw.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the structure of fixing a printed circuit board includes a mold frame coupled with a display panel, a printed circuit board positioned at a rear surface of the display panel and electrically connected to a pad portion of the display panel, and an insulating film covering an outer surface of the printed circuit board.

In yet another aspect, the structure of fixing a printed circuit board includes a mold frame coupled with a display panel, a printed circuit board positioned at a rear surface of the display panel and electrically connected to a pad portion of the display panel, a first insulating film attached to the mold frame and the printed circuit board, the first insulating film covering an outer surface of the printed circuit board and having a protruding portion, and a second insulating film attached to the mold frame and the first insulating film, the second insulating film covering the protruding portion.

In another aspect, the method for fixing a printed circuit board on a display panel includes coupling a mold frame with the display panel, the display panel having a printed circuit board positioned at a rear surface of the display panel and electrically connected to a pad portion of the display panel, attaching a first insulating film to the mold frame and the printed circuit board, the first insulating film covering an outer surface of the printed circuit board and having a protruding portion, and attaching a second insulating film to the mold frame and the first insulating film, the second insulating film covering the protruding portion.

In yet another aspect, the method for fixing a printed circuit board on a display panel includes coupling the display panel with a mold frame, the display panel having the printed circuit board electrically connected thereto, positioning the printed circuit board on a rear surface of the display panel, and attaching a first insulating film to a first portion of the mold frame, the first insulating film covering an outer surface of the printed circuit board.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
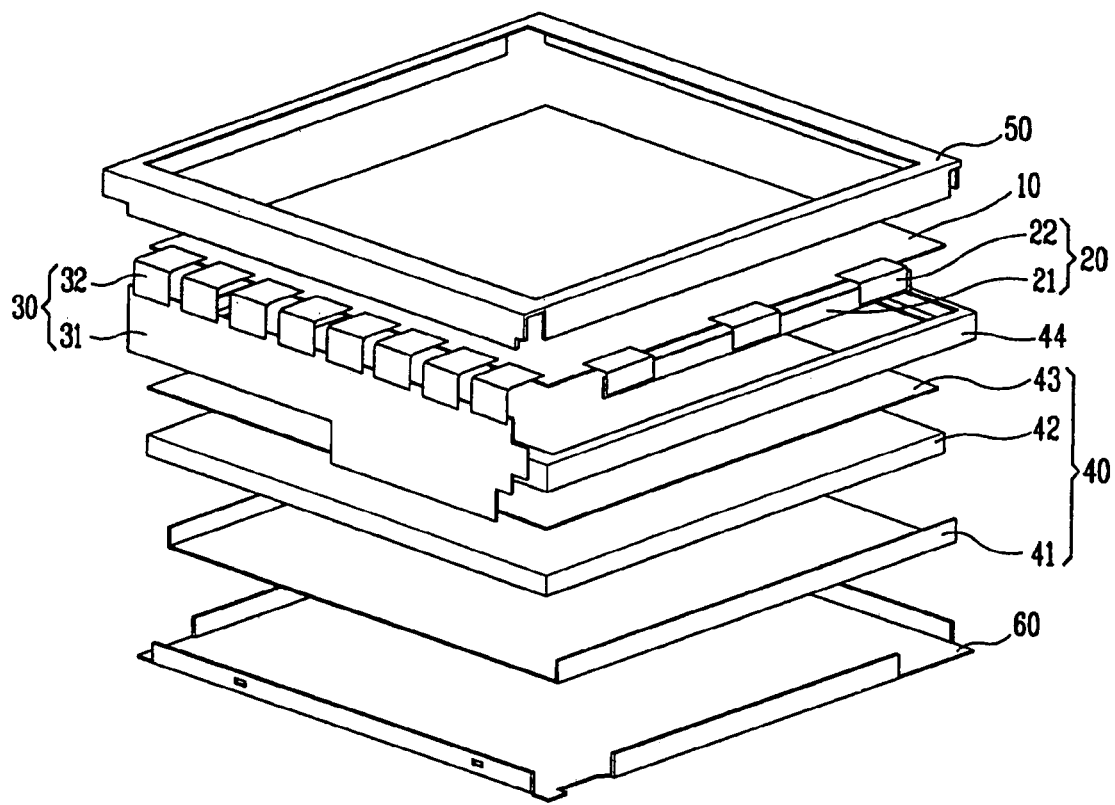
FIG. 1 is a disassembled perspective view schematically showing a liquid crystal display device according to the related art.
Figure 2A:
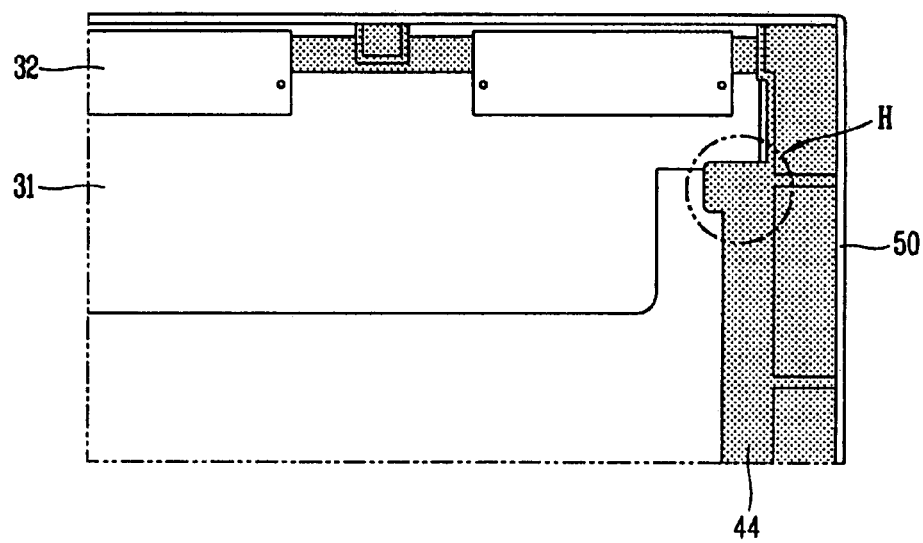
FIG. 2A is a planar view of a portion of a rear side of a liquid crystal display device without a lower case according to the related art.
Figure 2B:
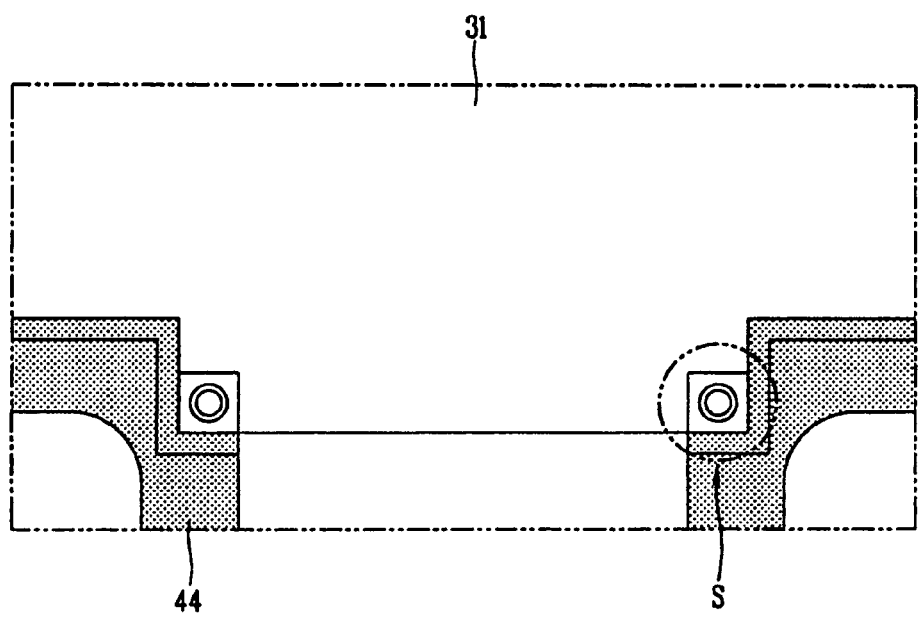
FIG. 2B is a planar view of a portion of a rear side of another liquid crystal display device according to the related art.
Figure 3:
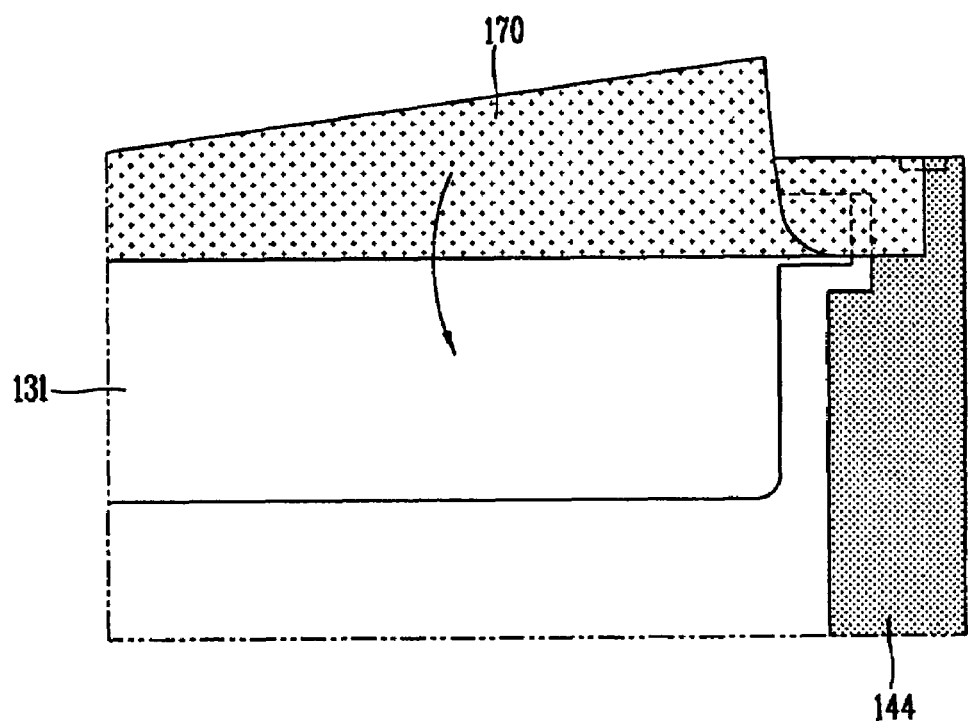
FIG. 3 is an exemplary view schematically showing a structure of fixing a printed circuit board according to an embodiment of the present invention.

FIG. 3 is an exemplary view schematically showing a structure of fixing a printed circuit board according to an embodiment of the present invention. In FIG. 3, a printed circuit board 131 may have a tape carrier package (not shown) attached thereon and may be a data printed circuit board. In particular, the tape carrier package may be bent such that the printed circuit board 131 is positioned at a rear surface of a liquid crystal display panel (not shown). An insulating film 170 may be coupled to the printed circuit board 131 and may cover the entire outer surface of the printed circuit board 131, thereby fixing and protecting the printed circuit board 131. An insulating film 170 may include polyethylene terephthalate (PET).

In addition, the PET 170 may be coupled to the printed circuit board 131 to form an integral body using a double-sided tape (not shown) along an edge region of the printed circuit board 131. This edge region may be along a short side of a mold frame 144. As a result, the PET 170 may affix and protect the printed circuit board 131. In addition, the printed circuit board 131 may be easily affixed by fixing the PET 170 to the printed circuit board 131 using the double-sided tape without a fixing means, such as a hook and a screw.

Figure 4A:
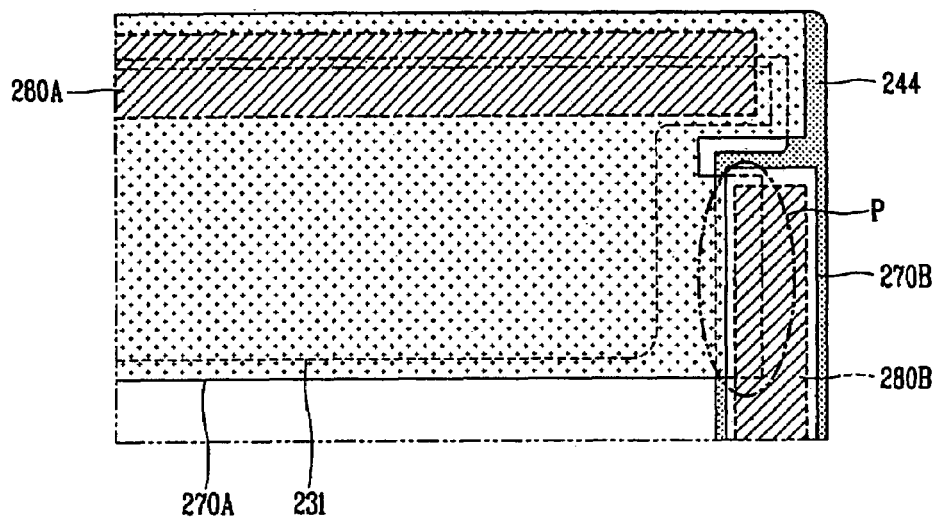
FIGS. 4A and 4B are exemplary views schematically showing a structure of fixing a printed circuit board according to another embodiment of the present invention.
Figure 4B:
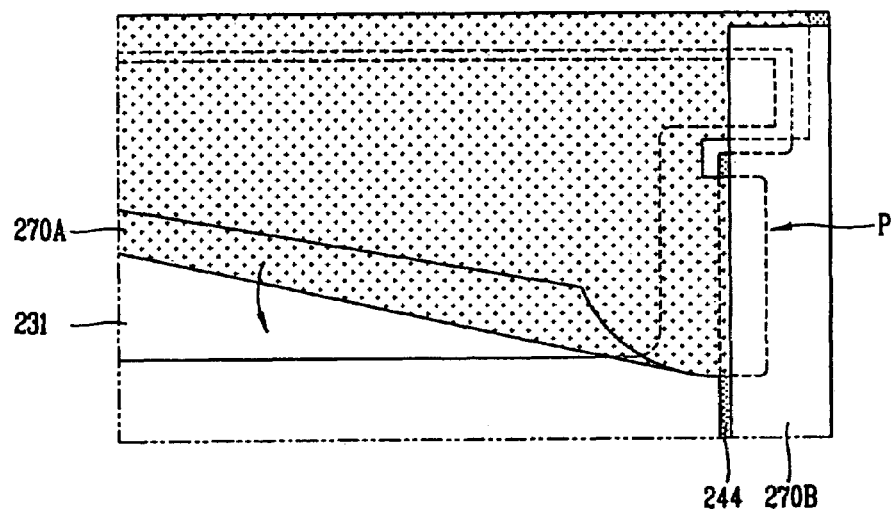

FIGS. 4A and 4B are exemplary views schematically showing a structure of fixing a printed circuit board according to another embodiment of the present invention. As shown in FIGS. 4A and 4B, a first PET 270A may include a protruding portion P protruding toward a mold frame 244 and a printed circuit board 231 may have a tape carrier package (not shown) attached thereon. The printed circuit board 231 may be a data printed circuit board. The first PET 270A may cover the entire outer surface of the printed circuit board 231 and may be coupled to the printed circuit board 231 to form an integral body using a first double-sided tape 280A along an edge region of the printed circuit board 231. The first PET 270A also may be cover an upper surface of the mold frame 244 adjacent to a gate pad portion of a LCD display panel.

In addition, a second PET 270B may cover a portion of the mold frame 244 (hereinafter called a "mold frame of a long side") which overlaps the protruding portion P. The second PET 270B also may cover the protruding portion P. In particular, the second PET 270B may be coupled to the protruding portion P and the mold frame 244 using a second double-sided tape 280B. The first PET 270A may be a source PET, and the second PET 270B may be a gate PET.

Thus, the printed circuit board 231 may form an integral body with the first PET 270A, and may be fixed and protected by the first PET 270A. Further, in order to prevent the printed circuit board from moving, the first PET 270A may include the protruding portion P overlapping a portion of the mold frame 244 and the second PET 270B may cover the protruding portion P. Accordingly, the printed circuit board 231 is securely affixed and protected without much difficulty.

Moreover, a method for fixing a printed circuit board may include mounting the first PET 270A on the mold frame 244, overlapping the protruding portion P of the first PET 270A with a side portion of the mold frame, and mounting the second PET 270B on the mold frame 244 covering the protruding portion P. In particular, the first PET 270A and the printed circuit board 231 may form an integral body using the first double-sided tape 280A. In addition, the first PET 270A may be mounted along a long side of the mold frame 244.

Further, aligning the second PET 270B to cover the protruding portion P of the first PET 270A and an upper corner portion of the mold frame 244 may be performed before attaching the second PET 270B to the mounting frame 244 using the second double-sided tape 280B. As a result, as shown in drawings, the first PET 270A is securely fixed and the printed circuit board 231 is prevented from moving. Accordingly, a hook, which may cause damages to a tape carrier package or a chip-on-film, is not used. However, if reinforcement is desired, a hook or a screw may be used to additionally fix the printed circuit board.

In addition, productivity increases without increasing fabrication cost because assembling and disassembling a printed circuit board may be carried easily in comparison to the fixing methods using a hook or a screw and because an insulating film is not expensive.

It will be apparent to those skilled in the art that various modifications and variations can be made in the structure of fixing a printed circuit board and the method for fixing thereof of the present invention without departing from the spirit or scope of the invention. Thus, it is intended that the present invention covers the modifications and variations of this invention provided they come within the scope of the appended claims and their equivalents.

What is claimed is:

1. A structure of fixing a printed circuit board, comprising:
a mold frame coupled with a display panel;
the printed circuit board positioned at a rear surface of the display panel and electrically connected to a pad portion of the display panel;
a first insulating film attached to the mold frame and the printed circuit board, the first insulating film covering an outer surface of the printed circuit board and one side of the mold frame; and
a second insulating film attached to the mold frame, the second insulating film covering the other side of the mold frame so that the printed circuit board is fixed to the mold frame.

2. The structure according to claim 1, wherein the first insulating film is attached to the printed circuit board using an adhesive.

3. The structure according to claim 2, wherein the adhesive includes a double-sided tape.

4. The structure according to claim 1, wherein the second insulating film is attached to the mold frame using an adhesive.

5. The structure according to claim 4, wherein the adhesive includes a double-sided tape.

6. The structure according to claim 1, wherein the first insulating film completely covers the outer surface of the printed circuit board.

7. The structure according to claim 1, wherein the first and second insulating films include polyethylene terephthalate (PET).

8. A structure of fixing a printed circuit board, comprising:
a mold frame coupled with a display panel;
the printed circuit board positioned at a rear surface of the display panel and electrically connected to a pad portion of the display panel;
a first insulating film attached to the mold frame and the printed circuit board using a first double-sided tape, the first insulating film covering an outer surface of the printed circuit board and one side of the mold frame, wherein the first insulating film has a protruding portion protruding toward the other side of the mold frame; and
a second insulating film attached to the mold frame and the first insulating film using a second double-sided tape, the second insulating film covering the protruding portion and the other side of the mold frame so that the printed circuit board is fixed to the mold frame.

9. The structure according to claim 8, wherein the first insulating film completely covers the outer surface of the printed circuit board.

10. The structure according to claim 8, wherein the first and second insulating films include polyethylene terephthalate (PET).

11. The structure according to claim 10, wherein the first insulating film includes a source PET.

12. The structure according to claim 10, wherein the second insulating film includes a gate PET.

* * * * *